US009685472B2

(12) United States Patent
Crocherie et al.

(10) Patent No.: US 9,685,472 B2
(45) Date of Patent: Jun. 20, 2017

(54) IMAGE SENSOR WITH REDUCED SPECTRAL AND OPTICAL CROSSTALK AND METHOD FOR MAKING THE IMAGE SENSOR

(71) Applicants: STMICROELECTRONICS SA, Montrouge (FR); STMICROELECTRONICS (CROLLES 2) SAS, Crolles (FR)

(72) Inventors: Axel Crocherie, Grenoble (FR); Michel Marty, Saint Paul de Varces (FR); Jean-Luc Huguenin, Grenoble (FR); Sébastien Jouan, Crolles (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/050,579

(22) Filed: Feb. 23, 2016

(65) Prior Publication Data

US 2017/0062507 A1 Mar. 2, 2017

(30) Foreign Application Priority Data

Aug. 24, 2015 (FR) ..................................... 15 57884

(51) Int. Cl.
*H01L 21/00* (2006.01)
*H01L 31/113* (2006.01)
*H01L 27/146* (2006.01)
*H01L 29/66* (2006.01)

(52) U.S. Cl.
CPC .. *H01L 27/14621* (2013.01); *H01L 27/14629* (2013.01); *H01L 29/66977* (2013.01)

(58) Field of Classification Search
CPC .................................................. H01L 27/14621
USPC ........................ 438/69–72; 257/98, 258, 294
See application file for complete search history.

(56) References Cited

U.S. PATENT DOCUMENTS

| 5,817,396 | A | * | 10/1998 | Perlo | ......................... | G02B 1/11 428/141 |
| 7,145,721 | B2 | * | 12/2006 | Banish | ..................... | G02B 1/11 359/569 |
| 8,120,027 | B2 | * | 2/2012 | Forbes | ................ | H01L 31/0236 257/53 |
| 8,506,704 | B2 | * | 8/2013 | Belouet | ............... | H01L 31/0236 117/34 |

(Continued)

FOREIGN PATENT DOCUMENTS

FR 3014245 6/2015

*Primary Examiner* — Calvin Lee
(74) *Attorney, Agent, or Firm* — Slater Matsil, LLP

(57) ABSTRACT

An integrated image sensor may include adjacent pixels, with each pixel including an active semiconductor region including a photodiode, an antireflection layer above the photodiode, a dielectric region above the antireflection layer and an optical filter to pass incident luminous radiation having a given wavelength. The antireflection layer may include an array of pads mutually separated by a dielectric material of the dielectric region. The array may be configured to allow simultaneous transmission of the incident luminous radiation and a diffraction of the incident luminous radiation producing diffracted radiations which have wavelengths below that of the incident radiation, and are attenuated with respect to the incident radiation.

20 Claims, 3 Drawing Sheets

(56) References Cited

U.S. PATENT DOCUMENTS

| | | | |
|---|---|---|---|
| 9,340,453 B2 * | 5/2016 | Schiavoni | ............... C03B 13/08 |
| 2009/0272880 A1 | 11/2009 | Stanton et al. | |
| 2013/0113964 A1 | 5/2013 | Sasaki et al. | |
| 2013/0175449 A1 | 7/2013 | Favier | |
| 2015/0054042 A1 | 2/2015 | Marty et al. | |

* cited by examiner

IMAGE SENSOR WITH REDUCED SPECTRAL AND OPTICAL CROSSTALK AND METHOD FOR MAKING THE IMAGE SENSOR

TECHNICAL FIELD

Embodiments of the invention relate to optical image sensors, especially CMOS image sensors with front side or rear side illumination and, more particularly, to the reduction of crosstalk between adjacent pixels in such sensors.

BACKGROUND

Referring to FIG. 1, an image sensor according to the prior art is shown. FIG. 1 provides a schematic sectional view of a first pixel 1, adjacent to a second pixel 2 of a CMOS image sensor of a type with front side illumination (FSI). The two pixels have analogous structures. The two pixels may, for example, form part of a Bayer pattern, which is well known to the skilled artisan.

The first pixel 1 is produced on a semiconductor substrate 10, within which is a photoreceptor, e.g., a photodiode. The substrate 10 is surmounted by an interconnection part or portion 11, commonly referred to as the BEOL (Back End Of Line). An antireflection layer 4 may be produced between the photodiode and the interconnection portion to ensure good transmission of the light rays.

The interconnection portion 11 includes various metallization levels M1, M2 and vias shrouded in one or more dielectric materials. Color filters 12 and 22 are situated on the interconnection portion 11, facing the photodiodes. It should be noted that the metallization levels M1 and M2 are produced in such a way that they are not situated in the region between the optical filter and the photodiode. Only a dielectric region covers the antireflection layer 4. The pixel is surmounted by a collimation lens 13, making it possible to optimize the collection of the light rays at the level of the photodiode.

The color filter 12 of the first pixel 1 may, for example, be configured to allow the wavelength corresponding to the color red to pass, and the filter 22 of the second pixel 2 may be configured to allow the wavelength corresponding to the color green to pass.

During operation, the photons absorbed by the photodiode cause the generation of charge carriers, which create an electric current in the photodiode. The mutual proximity of the pixels may give rise to a particularly significant crosstalk phenomena in image sensors having reduced or relatively small dimensions. Crosstalk arises when an optical signal 3 arriving, for example, at the first pixel 1 is not totally collected by the corresponding photodiode 10, thus degrading the performance of the sensor, especially the color rendition.

An optical crosstalk is when the photons passing through a filter reach the photodiode of an adjacent pixel. For example, the optical signal 32, after having been filtered by the optical filter 22 of the second pixel 2 (optical signal 31), reaches the photodiode 10 of the first pixel 1 instead of reaching the photodiode 20 of the second pixel 2.

A spectral crosstalk is when the optical filter is not selective enough and allows through wavelengths for which it is not configured. For example, a luminous signal, after passing within the green filter may comprise wavelengths below or above that of green.

The crosstalk may also be of electrical origin when the electrons generated by the photodiode of a pixel disperse in an adjacent pixel. This crosstalk of electrical origin is not the subject of the present patent application.

In FIG. 2 the curves of quantum efficiency of a set of pixels forming a Bayer pattern are illustrated. The three curves B, G, R correspond respectively to the quantum efficiency of the blue, green and red pixels of the sensor. The part G1 of the curve G shows that the green pixel detects a significant share of signals whose wavelength corresponds to the color blue. In an analogous manner, the part R1 of the curve R shows that the red pixel detects a significant share of signals, including the wavelength corresponding to the color green. These spurious detections attest to the crosstalk phenomena explained above.

SUMMARY

According to one embodiment, an image sensor is provided which helps to reduce the phenomena of optical and spectral crosstalk, and therefore to obtain curves of quantum efficiency B, G, R having steeper slopes.

According to one aspect, an integrated image sensor is provided including adjacent pixels, with each pixel including a semiconductor active region containing a photodiode, an antireflection layer above the photodiode, a dielectric region above the antireflection layer, and an optical filter to allow an incident luminous radiation having a given wavelength to pass.

According to a general characteristic of this aspect, the antireflection layer may include an array of pads mutually separated by a dielectric material of the dielectric region. The array may be configured to allow at the same time a transmission, optimized to the extent possible, of the incident luminous radiation and a diffraction of the incident luminous radiation producing diffracted radiations which have wavelengths below that of the incident radiation and are attenuated with respect to the incident radiation.

Thus, the phenomena of optical and spectral crosstalk are reduced by proposing an antireflection layer providing the dual function of antireflection to ensure desired transmission of the incident radiation and of a high-pass filter to eliminate, to the extent possible, the wavelengths below the incident wavelength.

According to one embodiment, the pad array is periodic, and its period is less than the ratio between the given wavelength and the sum of the refractive index of the material of the active region and of the product of the refractive index of the dielectric material times the sine of the angle of incidence of the incident radiation.

According to another embodiment, the height and the diameter of the pads may be chosen in such a way that the refractive index of the antireflection layer is the closest to the square root of the product of the refractive index of the material of the active region times the refractive index of the dielectric material. Advantageously, the pads may be circular. As such, the antireflection layer exhibits a symmetric structure which confers on it isotropic behavior.

The pads may comprise silicon or polysilicon, although other materials may also be used.

Each pixel may further include a microlens above the corresponding filter. This makes it possible to converge the light rays towards the photodiode and therefore to optimize the collection of the signal on the antireflection layer.

According to one embodiment, the area of the antireflection layer occupied by pads can be adapted to the wavelength to be filtered. For example, for a given wavelength close to 450 nanometers (i.e., close to the color blue), 30% of the area of the antireflection layer of the corresponding pixel may comprise pads; for a given wavelength close to 540 nanometers (i.e., close to the color green), 49% of the area of the antireflection layer of the corresponding pixel may comprise pads; and for a given wavelength close to 610 nanometers (i.e., close to the color red), 56% of the area of the antireflection layer may comprise pads. These values in % are merely examples, and may be adapted by the skilled artisan for different embodiments as a function of the material of the pads, the thickness of the pads, the period of the pads, and the incident wavelength.

The image sensor may be of type with front side illumination, or with rear side illumination.

BRIEF DESCRIPTION OF THE DRAWINGS

Other advantages and characteristics will become apparent upon examining the detailed description of non-limiting embodiments and the appended drawings, in which.

DETAILED DESCRIPTION

Figure 3:
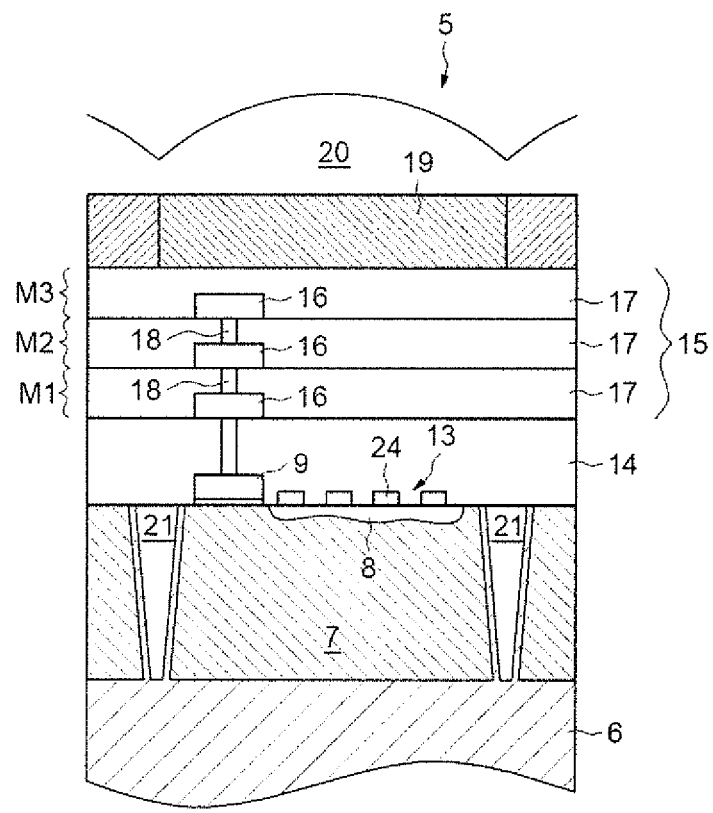
FIG. 3 is a schematic cross-sectional diagram of a pixel of a CMOS image sensor with front side illumination in accordance with an example embodiment.

FIG. 3 illustrates a schematic section through a pixel 5 of a CMOS image sensor with front side illumination, which illustratively includes an antireflection layer. The pixel is laterally insulated from the neighboring pixels by a deep trench isolation (DTI) 21. The pixel includes, above a substrate 6, an active layer 7 (e.g., P types conductivity) including a buried zone 8 (e.g., N type conductivity) in proximity to the upper side of the layer 7, e.g., forming a photodiode.

The upper side of the layer 7 supports, for example, a transfer transistor 9 and an antireflection layer 13 including pads 24 situated above the photodiode 8. The transistor 9 and layer 13 are wrapped in or covered by an insulating layer 14, e.g., PreMetal Dielectric (PMD). This insulating layer includes a first dielectric material, e.g., silicon dioxide.

The PMD layer 14 is surmounted or covered by an interconnection part or portion 15, commonly referred to as the Back End Of Line (BEOL). The part 15 includes various metallization levels. In the present example, there are three levels M1, M2 and M3, each comprising electrically conducting tracks 16 as well as vias 18 shrouded in a dielectric region comprising a second dielectric material 17, commonly referred to as InterMetal Dielectric (IMD).

The pixel 5 also illustratively includes a color filter 19 situated above the last metallization level M3 facing the photodiode 8. This filter is configured to allow through only certain wavelengths of a luminous signal. For example, here the wavelengths close to 540 nanometers corresponding to the color green are allowed to pass.

A collimation lens 20 is advantageously disposed above the optical filter 19. The lens directs the incident rays towards the photodiode 8 to the maximum extent possible.

Figure 4:
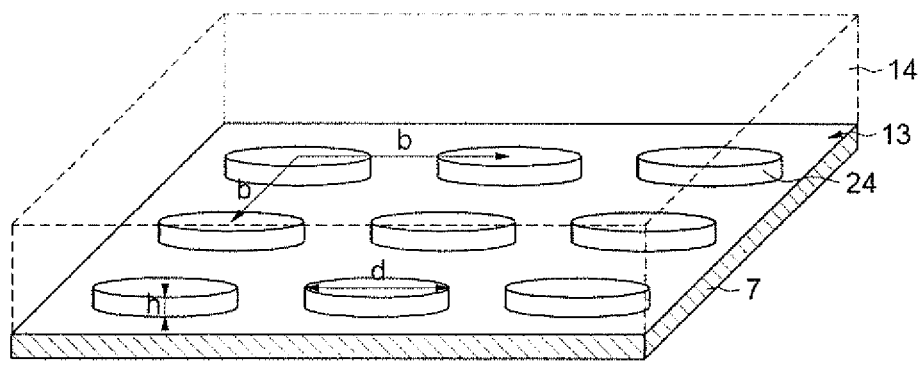
FIG. 4 is perspective view of the antireflection layer of the pixel of FIG. 3 in greater detail.
Figure 5:
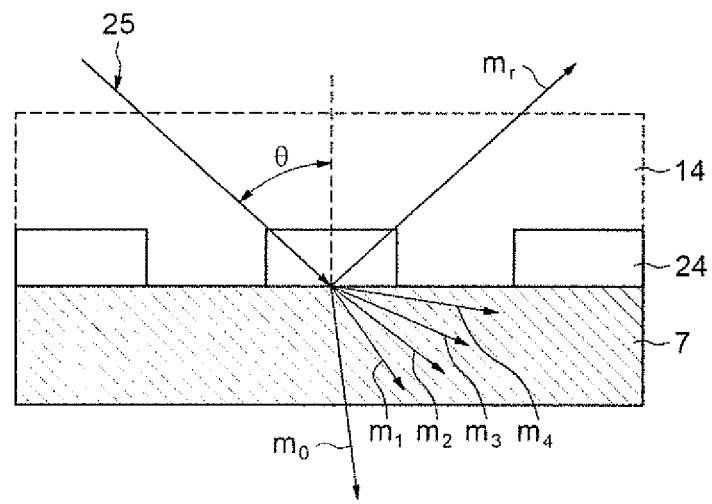
FIG. 5 is a schematic cross-sectional view of the antireflection layer of the pixel of FIG. 3 in greater detail.

Referring to FIGS. 4 and 5, the antireflection layer 13 is illustrated in greater detail. The layer 13 is produced or formed on the substrate 7 and includes the array of pads 24, e.g., circular polysilicon pads. The shape of the pads 24 is not limited to a circular shape, rather the pads may be various different shapes. However, a circular shape makes it possible to have a symmetric structure of the antireflection layer, and thus isotropic behavior. The pads 24 are shrouded in the silicon oxide of the insulating layer 14, which is represented as transparent in FIG. 3 for simplification.

The pads 24 may, for example, be formed after the deposition of the insulating layer 14 by etching the layer 14 at the location of the pads, then by filling the orifices thus obtained with polysilicon according to the desired pad thickness. The orifices above the polysilicon pads may then be plugged with silicon oxide. Finally, a step of chemical-mechanical planarization (CMP) of the structure is applied.

The refractive index n of the antireflection layer disposed between the substrate 7 (which has a refractive index $n_s$) and the layer 14 (which has a refractive index $n_i$) will ideally satisfy the formula $$n = \sqrt{n_i * n_s}$$

For silicon in the wavelengths close to green, for example, theoretically $n_s$ is equal to about 4 and the theoretical index $n_i$ of the dielectric PMD is equal to about 1.5.

Furthermore, for such an array structure, diffraction orders appear for a light ray of a given wavelength λ and angle of incidence θ when the period b of the array satisfies the equation:

$$b < \frac{\lambda}{(n_s + n_i * \sin(\theta))}$$

For example, for a pixel with a green color filter, the pads 24 are organized here as a regular array of period b equal to 100 nanometers. Their height h is 50 nanometers, and their diameter d is 70 nanometers.

One advantage of an array structure is that, by adapting the ratio between the area occupied by the pads with respect to the total area, it is possible to vary the ratio between the quantity of polysilicon of the pads and the quantity of silicon oxide of the PMD layer 14 present in the antireflection layer. It is therefore possible to adapt the refractive index of the antireflection layer by configuring the diameter d of the pads to obtain the desired refractive index n, which will be between 1.5 and 4.

By way of example, 49% of the area of the antireflection layer occupied by pads 24 leads to a configuration best adapted for the transmission of signals of wavelength close to 540 nanometers (green). In this example, and with the values of b, h, and d mentioned above, the refractive index n of the antireflection layer is in the vicinity of 2.4.

When an incident light ray 25 arrives at the antireflection layer 13, it is transmitted within the substrate 7 in the form of a transmitted ray $m_0$, reflected by the antireflection layer in the form of a reflected ray $m_r$ and diffracted as several diffracted rays $m_1$, $m_2$, $m_3$, $m_4$ . . . of different wavelengths, each corresponding to a different mode of diffraction and order. The incident ray 25 may, for example, have previously passed through the optical filter 19 and because the filter is not perfect, includes wavelengths remote from 540 nanometers.

The transmitted light ray $m_0$, corresponding to the wavelength for which the filter is configured (here the wavelengths close to 540 nanometers and corresponding to the color green), deviates very little, if at all. The diffracted rays of higher orders, corresponding to the signals of wavelengths below the desired wavelength, undergo a diffraction proportional to their diffraction order. Thus, the second-order ray $m_2$ has a lower transmittance than the ray $m_1$ of order one, and so on and so forth.

Figure 6:
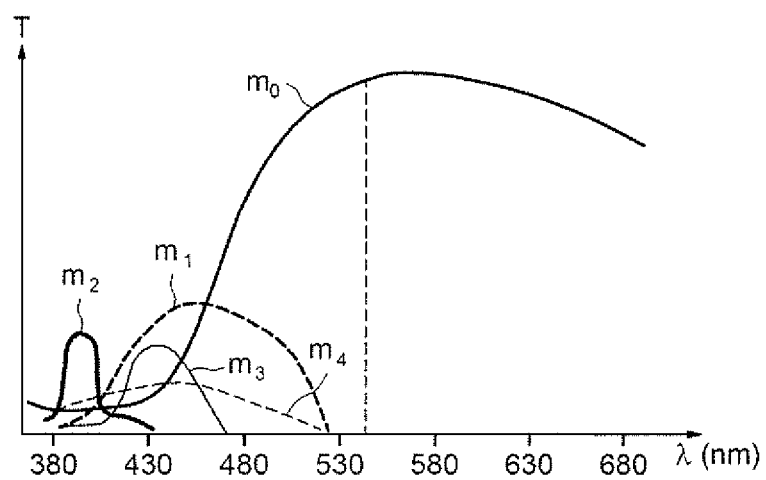
FIG. 6 is a graph illustrating the transmittance of the antireflection layer for an incident luminous signal in the device of FIG. 3.

FIG. 6 schematically represents the transmittance of the antireflection layer 14 for the incident luminous signal. Here, the best transmittance corresponds to the transmitted signal $m_0$ of wavelength 540 nanometers. It may be observed that the luminous signals $m_1$, $m_2$, $m_3$, $m_4$, respectively of orders 1, 2, 3, 4, are very attenuated with respect to the main order, and appear for wavelengths below 540 nm. Thus, the antireflection layer 13 behaves as a high-pass filter, attenuating or eliminating the signals of wavelengths below the desired wavelength, here 540 nanometers.

The antireflection layer may also be adapted to the color blue, in which case 30% of the area of the layer is occupied by pads 50 nanometers in height and 55 nanometers in diameter, and the period of the array is 100 nanometers. In this example, the refractive index of the antireflection layer is in the vicinity of 3.2.

In another example embodiment, the antireflection layer may also be adapted to the color red, in which case 56% of the area of the layer is occupied by pads 50 nanometers in height and 225 nanometers in diameter, and the period of the array is 300 nanometers. In this example, the refractive index of the antireflection layer is in the vicinity of 2.7.

Figure 1:
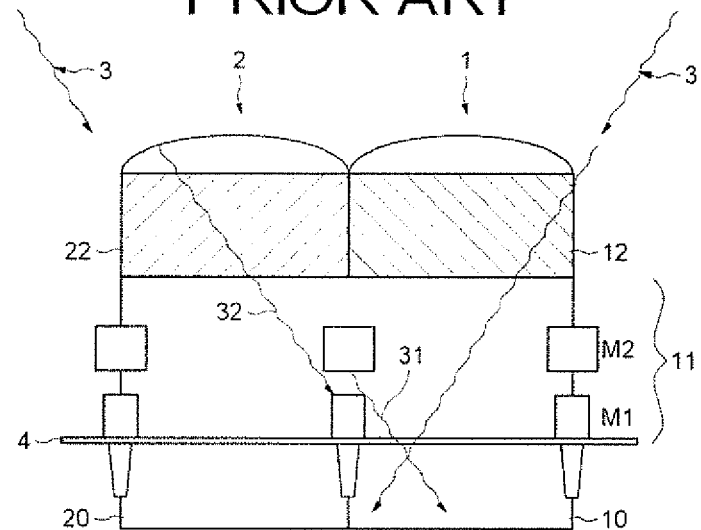
FIG. 1 is a schematic block diagram of an image sensor in accordance with the prior art.
Figure 2:
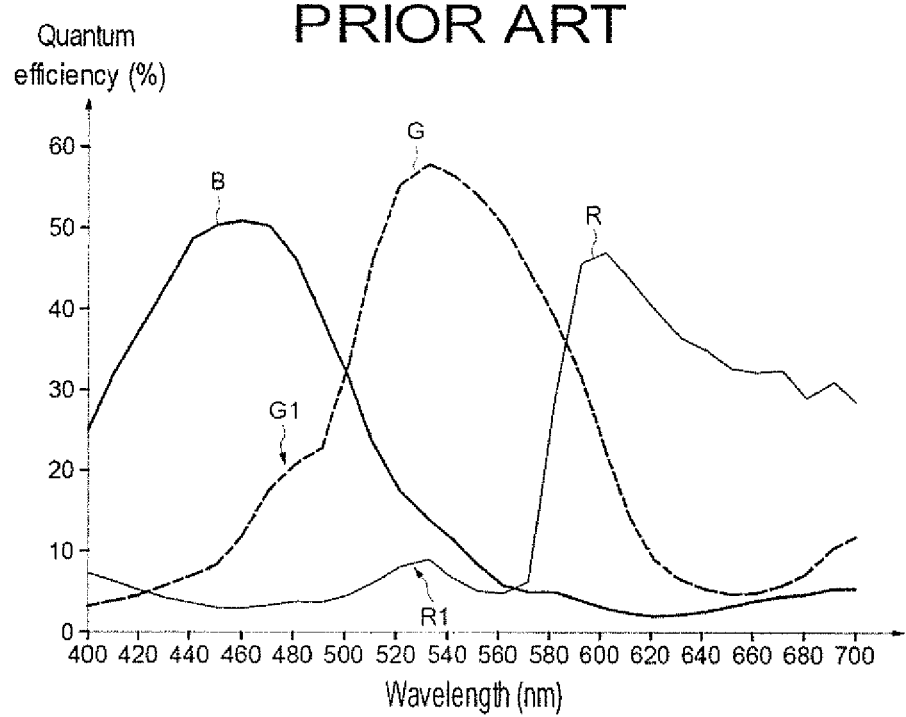
FIG. 2 is a graph illustrating curves of quantum efficiency of a set of pixels such as in the image sensor of FIG. 1 forming a Bayer pattern in accordance with the prior art.

These various values are merely indicative and should be adapted by the person skilled in the art as a function of the transmission of the layer and of the cutoff wavelength which are desired in different embodiments. Nonetheless, using this approach it is possible to reduce the spectral and optical crosstalk by attenuating the humps G1 and R1 of FIG. 2.

Although the pixel 5 exhibited in these examples is of a type with front side illumination, the antireflection layer 13 may also be integrated into pixels of a type with rear side illumination. In this case, the pads are obtained by depositing a layer of polysilicon, for example, according to the desired thickness h, then by the etching the layer to define the geometry of the pads. Further, the dielectric material of the PMD insulating layer is deposited. A step of chemical-mechanical planarization (CMP) of the structure may then be performed.

That which is claimed is:

1. A method for making an image sensor comprising:
forming a plurality of pixels to one another and each comprising an active semiconductor active region; and
defining a photodiode, an antireflection layer above the photodiode, a dielectric region above the antireflection layer, and an optical filter to pass an incident luminous radiation having a given wavelength associated therewith,
the antireflection layer comprising an array of pads separated by adjacent portions of the dielectric region, the array of pads positioned to allow simultaneous transmission of the incident luminous radiation and a diffracted radiation from the incident luminous radiation, the diffracted radiation having wavelengths below that of the given wavelength associated with the incident radiation and also being attenuated with respect to the incident radiation.

2. The method of claim 1 wherein the array of pads is periodic with a period b such that:

$$b < \frac{\lambda}{(n_s + n_i * \sin(\theta))},$$

where $\lambda$ is the given wavelength, $n_s$ is a refractive index of the active semiconductor region, $n_i$ is a refractive index of the dielectric region, and $\theta$ is an angle of incidence of the incident radiation.

3. The method of claim 1 wherein the pads comprise circular silicon pads.

4. The method of claim 1 wherein for a given wavelength in a range of 450 to 610 nanometers, an area of the antireflection layer of the associated pixel comprises pads is in a range of 30-56%.

5. An image sensor comprising:
a plurality of pixels adjacent to one another and each comprising
an active semiconductor region defining a photodiode,
an antireflection layer above the photodiode,
a dielectric region above the antireflection layer, and
an optical filter to pass an incident luminous radiation having a given wavelength associated therewith,
said antireflection layer comprising an array of pads separated by adjacent portions of said dielectric region, the array of pads positioned to allow simultaneous transmission of the incident luminous radiation and a diffracted radiation from the incident luminous radiation, the diffracted radiation having wavelengths below that of the given wavelength associated with the incident radiation and also being attenuated with respect to the incident radiation.

6. The image sensor of claim 5 wherein said pads are circular.

7. The image sensor of claim 5 wherein said pads comprise silicon.

8. The image sensor of claim 5 wherein each pixel further comprises a microlens above said optical filter.

9. The image sensor of claim 5 wherein for a given wavelength of 450 nanometers, 30% of an area of said antireflection layer of the associated pixel comprises pads.

10. The image sensor of claim 5 wherein for a given wavelength of 540 nanometers, 49% of the area of said antireflection layer of the associated pixel comprises pads.

11. The image sensor of claim 5 wherein for a given wavelength of 610 nanometers, 56% of the area of said antireflection layer of the associated pixel comprises pads.

12. The image sensor of claim 5 wherein for a given wavelength in a range of 450 to 610 nanometers, an area of said antireflection layer of the associated pixel comprising pads is in a range of 30-56%.

13. The image sensor of claim 5 wherein the image sensor comprises a front side illumination sensor.

14. The image sensor of claim 5 wherein the image sensor comprises a rear side illumination sensor.

15. The image sensor of claim 5 wherein the array of pads is periodic with a period b such that:

$$b < \frac{\lambda}{(n_s + n_i * \sin(\theta))},$$

where $\lambda$ is the given wavelength, $n_s$ is a refractive index of said active semiconductor region, $n_i$ is a refractive index of said dielectric region, and $\theta$ is an angle of incidence of the incident radiation.

16. The image sensor of claim 15 wherein a height and diameter of the pads define a refractive index n of the antireflection layer such that:

$$n=\sqrt{n_i * n_s}.$$

17. An image sensor comprising:
a plurality of pixels adjacent to one another and each comprising
an active semiconductor region defining a photodiode,
an antireflection layer above the photodiode,
a dielectric region above the antireflection layer, and
an optical filter to pass an incident luminous radiation having a given wavelength associated therewith,
said antireflection layer comprising an array of circular silicon pads separated by adjacent portions of said dielectric region, the array of pads positioned to allow simultaneous transmission of the incident luminous radiation and a diffracted radiation from the incident luminous radiation, the diffracted radiation having wavelengths below that of the given wavelength associated with the incident radiation and also being attenuated with respect to the incident radiation.

18. The image sensor of claim 17 wherein the array of pads is periodic with a period b such that:

$$b < \frac{\lambda}{(n_s + n_i * \sin(\theta))},$$

where $\lambda$ is the given wavelength, $n_s$ is a refractive index of said active semiconductor region, $n_i$ is a refractive index of said dielectric region, and $\theta$ is an angle of incidence of the incident radiation.

19. The image sensor of claim 17 wherein each pixel further comprises a microlens above said optical filter.

20. The image sensor of claim 17 wherein for a given wavelength in a range of 450 to 610 nanometers, an area of said antireflection layer of the associated pixel comprises pads is in a range of 30-56%.

* * * * *